(12) United States Patent
Dong et al.

(10) Patent No.: US 7,179,707 B2
(45) Date of Patent: Feb. 20, 2007

(54) METHOD OF FORMING GATE ELECTRODE IN SEMICONDUCTOR DEVICE

(75) Inventors: Cha Deok Dong, Ichon-Shi (KR); Ho Min Son, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 137 days.

(21) Appl. No.: 10/722,814

(22) Filed: Nov. 26, 2003

(65) Prior Publication Data

US 2004/0259369 A1    Dec. 23, 2004

(30) Foreign Application Priority Data

Jun. 20, 2003    (KR) .................... 10-2003-0040155

(51) Int. Cl.
*H01L 21/336* (2006.01)
*H01L 21/461* (2006.01)
*H01L 21/302* (2006.01)

(52) U.S. Cl. ................. 438/257; 438/719; 438/720; 438/721

(58) Field of Classification Search ............. 438/706, 438/714, 718–721
See application file for complete search history.

(56) References Cited

U.S. PATENT DOCUMENTS

| | | | | |
|---|---|---|---|---|
| 6,159,811 A * | 12/2000 | Shin et al. | ................ | 438/303 |
| 6,228,695 B1 * | 5/2001 | Hsieh et al. | ................ | 438/201 |
| 6,277,736 B1 * | 8/2001 | Chen et al. | ................ | 438/653 |
| 6,380,029 B1 * | 4/2002 | Chang et al. | ................ | 438/257 |
| 6,495,438 B1 * | 12/2002 | Shinmura | ................ | 438/592 |
| 6,544,896 B1 * | 4/2003 | Xu et al. | ................ | 438/710 |
| 6,642,112 B1 * | 11/2003 | Lowe et al. | ................ | 438/275 |
| 2002/0068398 A1 * | 6/2002 | Dong et al. | ................ | 438/201 |

FOREIGN PATENT DOCUMENTS

JP        2001-068670        3/2001

OTHER PUBLICATIONS

Office action issued by the Korean Intellectual Property Office dated Dec. 15, 2004.

* cited by examiner

*Primary Examiner*—Duy-Vu N. Deo
(74) *Attorney, Agent, or Firm*—Marshall, Gerstein & Borun LLP

(57) ABSTRACT

A method for forming a gate electrode in the semiconductor device is disclosed. The disclosed methods for forming a gate electrode in a semiconductor includes forming a polysilicon film and a metal silicide film sequentially on an upper portion of a semiconductor substrate; performing an annealing process to crystallize the metal silicide film, so that etch rate of the crystallized metal silicide film is similar to that of the polysilicon film; and forming a gate electrode by performing an etching process at one time on the metal silicide film and the polysilicon film using the similar etch rates of the crystallized metal silicide film and the polysilicon film. According to the disclosed methods, the tungsten silicide film is crystallized by an annealing process and the polysilicon film and the crystallized tungsten suicide film are etched at one time to prevent any formation of recesses of the polysilicon film, so that it is possible to form the gate electrode pattern having the vertical profile.

8 Claims, 2 Drawing Sheets

METHOD OF FORMING GATE ELECTRODE IN SEMICONDUCTOR DEVICE

BACKGROUND

1. Technical Field

A method of forming a gate electrode in a semiconductor device is disclosed and, more specifically, a method of forming a gate electrode which is constructed in a polycide structure is disclosed.

2. Discussion of Related Art

As semiconductor devices become more highly integrated, gate electrodes are constructed with a polycide structure where a metal silicide film is deposited on an upper surface of a polysilicon film to form the gate electrode because of the low resistance of the polysilicon film. In the formation of a gate electrode with a polycide structure, the polysilicon film and a metal silicide film are etched to form a gate electrode pattern having a vertical profile.

After the etching of the tungsten silicide film, the polysilicon film is etched. At the time of etching the tungsten silicide film, some portion of the polysilicon film is recessed. Then, another etching process is performed to pattern the gate electrode on the recessed polysilicon film. As a result, two etching processes are performed on the polysilicon film. Due to the two etching processes, the profile of the polysilicon film has a recessed-shape where the polysilicon is more recessed than the other films.

Since the polysilicon film has the aforementioned profile, it is difficult to form the gate electrode pattern in a proper vertical profile. As a result, the characteristics of the resulting device may be deteriorated as a result of the multiple etching processes.

SUMMARY OF THE DISCLOSURE

In order to solve the aforementioned problem, a method of forming a gate electrode in a semiconductor is disclosed which improves the vertical profile of the gate electrode.

A disclosed method of forming a gate electrode in a semiconductor comprises forming a polysilicon film and a metal silicide film sequentially on an upper portion of a semiconductor substrate; performing an annealing process to crystallize the metal silicide film, so that etch rate of the crystallized metal silicide film is similar to that of the polysilicon film; and forming a gate electrode by performing an etching process at one time on the metal silicide film and the polysilicon film by using the similar etch rates of the crystallized metal silicide film and the polysilicon film.

It is preferable that the annealing process is one of a rapid thermal process (RTP) annealing process and a furnace annealing process for crystallizing an amorphous metal silicide film to form a crystalline metal silicide film. In addition, it is preferable that wherein the RTP annealing process is performed at a temperature ranging from about 900° C. to about 1000° C. for about 10 to 30 seconds in an ambient of $N_2$ or $NH_3$ gas, and the furnace annealing process is performed at a temperature ranging from about 850° C. to about 1000° C. for about 5 to about 30 minutes in an ambient of $N_2$ or $NH_3$ gas.

It is preferable that the metal silicide film is a tungsten silicide film. In addition, it is preferable that the etching process is performed under a process condition for etching the polysilicon film.

And also, it is preferable that the etching process is a dry etching process, which is performed in an inductively coupled plasma chamber into which a mixture gas of $Cl_2$ or $O_2$ gas is introduced.

BRIEF DESCRIPTION OF THE DRAWINGS

The aforementioned aspects and features of the disclosed methods will be explained in the following description, taken in conjunction with the accompanying drawings, wherein.

Figure 1:
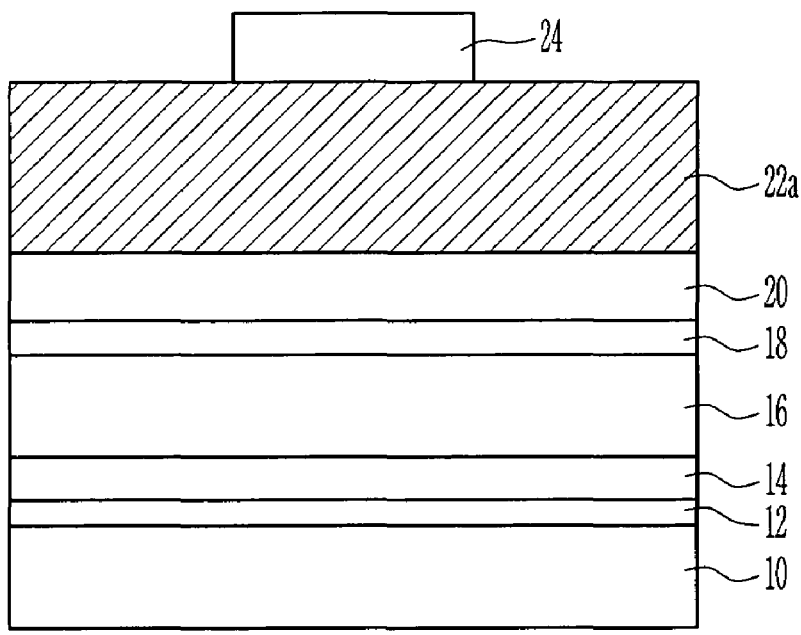
FIGS. 1 to 4 cross-sectional views for explaining a method of forming a gate electrode in the semiconductor device according to an embodiment of the present invention.

Thicknesses, etc., of the films in drawings are exaggerated to explain more clearly, and like reference numerals in drawings are used to identify the same or similar parts. Also, in the specification, the phrase that a certain film is on another film or on a semiconductor substrate means that the certain film may directly contact the another film or the semiconductor substrate, or otherwise a third film may be interposed between them.

DETAILED DESCRIPTION OF PREFERRED EMBODIMENTS

FIGS. 1 to 4 cross-sectional views for explaining a method of forming a gate electrode in the semiconductor device according to a disclosed method.

Referring to FIG. 1, a tunnel oxide film 12, a first polysilicon film 14 for a floating gate electrode, a second polysilicon film 16 for the floating gate electrode, a dielectric film 18, a third polysilicon film 20 for a control gate electrode, a tungsten suicide film 22a, and a hard mask 24 is sequentially formed on the entire upper surface of a semiconductor substrate 10 made up of silicon. The tunnel oxide film 12 is formed by a wet oxidation process at a temperature ranging from about 750° C. to about 800° C. and then a thermal treatment at a temperature ranging from about 900° C. to about 910° C. for a time period ranging from about 20 to about 30 minutes under an ambient of $N_2$ gas. The first polysilicon film 14 for the floating gate electrode is formed to have a thickness ranging from about 70 to 150 Å at a temperature ranging from about 500° C. to about 550° under a pressure ranging from about 0.1 to about 3 torr by an low pressure chemical vapor deposition method (hereinafter, referred to as LP-CVD method) using an Si source gas such as $SiH_4$ or $SiH_6$ and a $PH_3$ gas. The second polysilicon film 16 for the floating gate electrode may be formed to have a thickness ranging from about 600 to 1400 Å under the same process condition as that of the first polysilicon film 14. The dielectric film 18 is preferably formed in an ONO structure, that is, a stack structure where a first oxide film, a nitride film, and a second oxide film is sequentially formed. At this time, the first and second oxide films are loaded into a chamber for performing the process in a temperature range of from about 600° C. to about 700° C., formed to have a thickness of from about 35 to 60 Å under a pressure of below about 1 to about 3 torr at a temperature of from about 810° C. to 850° C. by the LP-CVD method, and formed to be one of an high temperature oxide (HTO) film using $SiH_2Cl_2$ (Dichloro Silane; DCS) gas as a source and another HTO film using $N_2O$ gas as a source. The nitride oxide film is formed to have a thickness of from about 50 to about 65 Å at a temperature ranging from about 650° C. to about 800° C. under a pressure of below about 1 to 3 torr by the LP-CVD method using NH₃ gas and SiH₂Cl₂ gas as reaction gases. Next, after the formation of the dielectric film 18, in order to improve characteristics of the dielectric film 18 and reinforce boundaries between the films, a steam annealing process is performed in a wet oxidation manner at a temperature ranging from about 750° C. to about 800° C. The steam annealing process is performed to form an oxidation film having a thickness ranging from about 150 to about 300 Å without time delay after the deposition of the dielectric film 18 in order to prevent any natural oxidation film and any contamination due to impurities. The third polysilicon film 20 for the control gate electrode is formed to have a thickness ranging from about 70 to about 150 Å at a temperature ranging from about 500° C. to about 550° C. under a pressure ranging from about 0.1 to about 3 torr by the LP-CVD method using an Si source gas such as SiH₄ or SiH₆ and a PH₃ gas. The tungsten silicide film 22 is an amorphous tungsten silicide film. The film is formed to have a thickness ranging from about 1000 to about 1200 Å by a reaction of SiH₄ (Mono Silane: MS) or SiH₂Cl₂ (Dichloro Silane: DCS) with WF₆ and then by adjusting stochiometric ratio ranging from about 2.0 to about 2.8 at a temperature ranging from about 300° C. to about 500° C. in order to implement a good step coverage and minimize the surface resistance of film. At this time, the thickness ranging from about 1000 to about 1200 Å of the tungsten silicide film 22 is formed in consideration of the reduction of about 20% of total thickness, that is, about 200 Å in the next annealing process.

Figure 2:
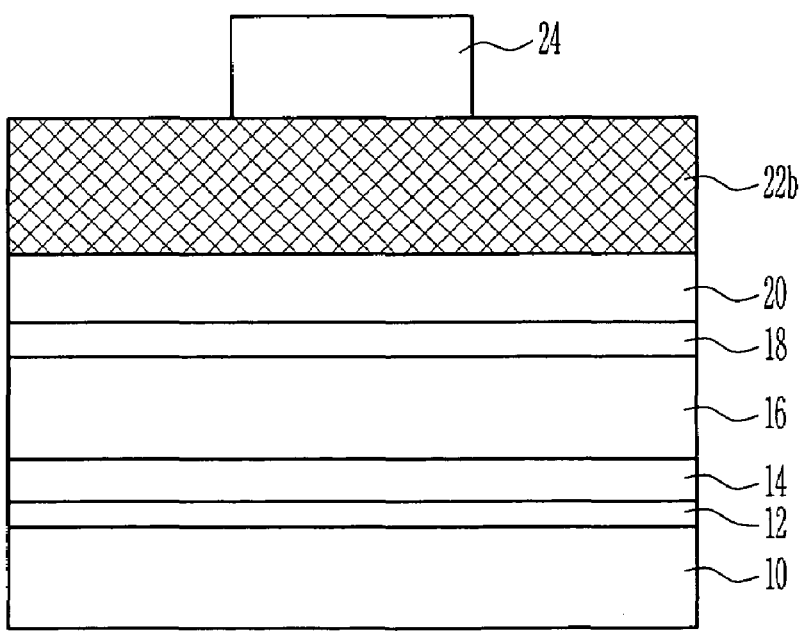

Referring to FIG. 2, an annealing process is formed on the resultant. By the annealing process, the amorphous tungsten silicide film 22a is crystallized to have the film characteristics, that is, an etch rate similar to that of the third polysilicon film 20. If the etch rate of the crystallized tungsten silicide film 22b is similar to that of the third polysilicon film 20, the crystallized tungsten suicide film 22b and the third polysilicon film 20 can be simultaneously etched by one time of etching operation at the etching process for patterning gate electrode. The annealing process used at this time is an RTP annealing process or a furnace annealing process. Herein, the RTP annealing process is performed at a temperature ranging from about 900° C. to about 1000° C. for a time period ranging from about 10 to about 30 seconds in an ambient of N₂ or NH₃ gas, and the furnace annealing process is performed at a temperature ranging from about 850° C. to about 1000° C. for a time period ranging from about 5 to about 30 minutes in an ambient of N₂ or NH₃ gas. In addition, in the annealing process, the thickness of the tungsten silicide film 22b having a total thickness ranging from about 1000 to about 1200 Å is reduced by about 200 Å, that is, 20% of the total thickness, and thus, the tungsten silicide film has a thickness ranging from about 800 to about 1000 Å.

Figure 3:
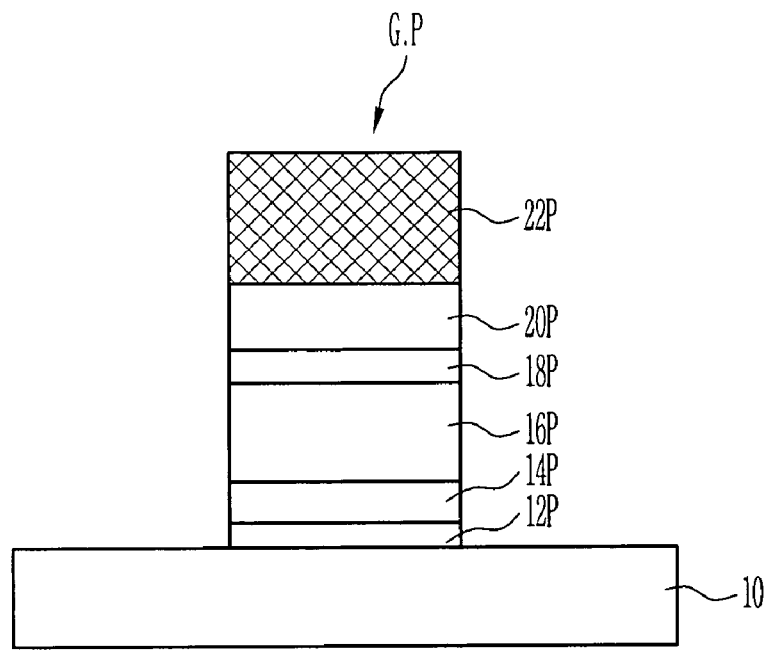

Referring to FIG. 3, an etching process is performed by using the hard mask 24 formed on the resultant as mask to form a gate electrode pattern G.P. Firstly, the etching process is performed on the crystallized tungsten silicide film 22b and the third polysilicon film 20 by using the hard mask 24 to form the patterned tungsten silicide film 22P and the patterned third polysilicon film 20P. Since the crystallized tungsten film 22b and the third polysilicon film 20 on which the etching process is performed have the similar etch rate to each other, the two films are simultaneously etched at one time. Therefore, one time of the etching process is performed the crystallized tungsten silicide film 22b and the third polysilicon film 20 to form the gate electrode, and thus, the formation of any recess of the third polysilicon film 20 can be prevented so that it is possible to form the gate electrode patter having a vertical profile. The etching process is a dry etching process which is performed in an inductively coupled plasma chamber into which a mixture of Cl₂ and O₂ gases is introduced in mixed ratio of about 4:6. Since the crystallized tungsten silicide film 22b and the third polysilicon film 20 is considered to have the similar etch rate in the etching process, the dry etching process is performed under the same process condition as the etching process on the third polysilicon film 20. Next, if the lower films is etched by using the third polysilicon film 20P and the tungsten silicide film 22P patterned as the aforementioned vertical profile, the patterned dielectric film 18P, the second polysilicon film 16P, and the first polysilicon film 14P, and the tunnel oxide film 12P are formed to complete the formation of the gate electrode pattern G.P. having the vertical profile.

Figure 4:
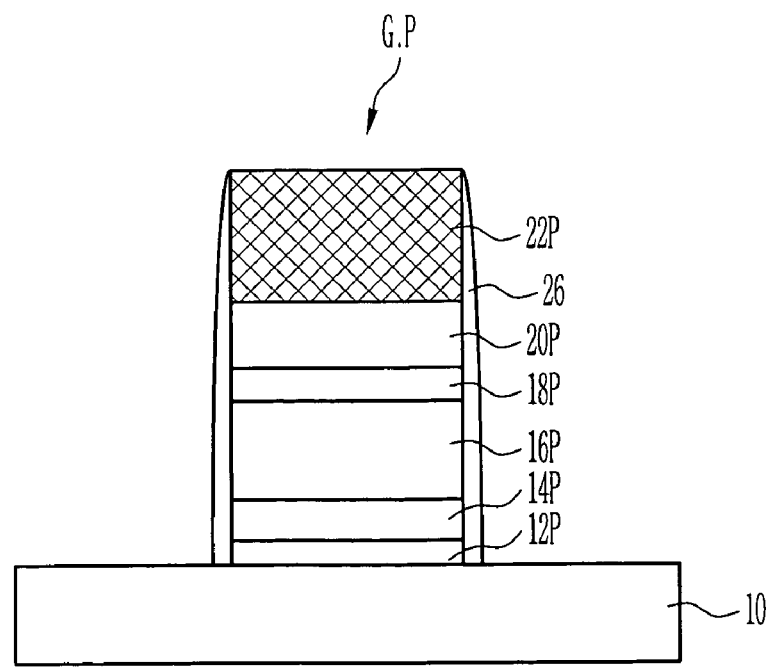

Referring to FIG. 4, an oxidation process is performed on the aforementioned gate electrode pattern G.P. Firstly, a cleaning process is performed as a preparation of the oxidation process on the gate electrode pattern G.P. For the cleaning process, an SC-1 (NH₄OH/H₂O₂/H₂O) cleaning solution which causes little damage to the oxidation films of the tunnel oxidation film 12 and the dielectric film 18 is used so that the slope of the side wall of the gate electrode pattern G.P. having the aforementioned vertical profile can not be lowered. When the oxidation process is performed on the entire surface of the resultant, a uniform oxidation film 26 is formed on the gate electrode pattern G.P. having the vertical profile so that roughness of the side wall can be stabilized. At this time, the oxidation process may be performed at a temperature ranging from about 750° C. to about 950° C. by a dry oxidation method which is easy to control the oxidation rate under the process condition of about 1 to about 10 slm of O₂ gas.

According to the preferred embodiments, the tungsten silicide film is crystallized by an annealing process and the polysilicon film and the crystallized tungsten silicide film are etched at one time to prevent any formation of recesses of the polysilicon film, so that it is possible to form the gate electrode pattern having an improved vertical profile.

Although the aforementioned embodiment discloses the gate electrode in a polycide structure in a flash memory device, the disclosed method can be adapted to any process for forming the gate electrode in the polycide structure.

As described above, using the disclosed methods, it is possible to obtain the effect to prevent deterioration of the device characteristics by crystallizing the tungsten silicide film in an annealing process, etching the polysilicon film and the crystallized tungsten silicide film at one time to prevent any formation of recesses of the polysilicon film, thereby forming the gate electrode pattern having the vertical profile.

Although the foregoing description has been made with reference to the preferred embodiments, it is to be understood that changes and modifications to the disclosed methods may be made by the ordinary skilled in the art without departing from the spirit and scope of this disclosure and the appended claims.

What is claimed is:

1. A method of forming a gate electrode in a semiconductor, comprising:

forming a first polysilicon film for the floating gate electrode on a semiconductor substrate and a dielectric film on the first polysilicon film;

forming a second polysilicon film for the control gate electrode on the dielectric film and a tungsten silicide film on the second polysilicon film;

performing an annealing process to crystallize the tungsten silicide film;

performing a first etching process to etch the crystallized tungsten silicide film and the second polysilicon film under the crystallized tungsten silicide film at one time using the same etching gas after the annealing process; and, performing a second etching process to etch the first polysilicon film for the floating gate electrode on a semiconductor substrate and the dielectric film on the first polysilicon film, thereby forming a gate electrode.

2. The method of forming a gate electrode in a semiconductor according to claim 1, wherein the annealing process is one of a rapid thermal process (RTP) annealing process and a furnace annealing process for crystallizing an amorphous tungsten silicide film to form a crystalline tungsten silicide film.

3. The method of forming a gate electrode in a semiconductor according to claim 2, comprising performing the RTP annealing process at a temperature ranging from about 900° C. to about 1000° C. for a time period ranging from about 10 seconds to about 30 seconds in an ambient atmosphere of $N_2$ or $NH_3$ gas, and performing the furnace annealing process at a temperature ranging from about 850° C. to about 1000° C. for a time period ranging from about 5 minutes to about 30 minutes in an ambient of $N_2$ or $NH_3$ gas.

4. The method of forming a gate electrode in a semiconductor-according to claim 1, comprising performing the first etching process under a process condition for etching the second polysilicon film for the control gate electrode.

5. The method of forming a gate electrode in a semiconductor according to claim 4, wherein the first etching process is a dry etching process, and comprising performing the first etching process in an inductively coupled plasma chamber into which a mixture gas of $Cl_2$ gas and $O_2$ gas is introduced.

6. The method of forming a gate electrode in a semiconductor according to claim 1, wherein the first etching process is a dry etching process, and comprising performing the first etching process in an inductively coupled plasma chamber into which a mixture gas of $Cl_2$ gas and $O_2$ gas is introduced.

7. The method of forming a gate electrode in a semiconductor according to claim 1, where in the annealing process results in the etch rate of the crystallized metal silicide film being similar to that of the second polysilicon film for the control gate electrode.

8. The method of forming a gate electrode in a semiconductor according to claim 1, comprising forming the tungsten suicide film by reacting $SiH_4$ or $SiH_2Cl_2$ with $WF_6$ at a stochiometric ratio of($SiH_4$ or $SiH_2Cl_2$): $WF_6$ of 2.0–2.8.

* * * * *